(12) United States Patent
Hayashi et al.

(10) Patent No.: US 11,380,573 B2
(45) Date of Patent: Jul. 5, 2022

(54) STRUCTURE FOR AUTOMATIC IN-SITU REPLACEMENT OF A PART OF AN ELECTROSTATIC CHUCK

(71) Applicant: TOKYO ELECTRON LIMITED, Tokyo (JP)

(72) Inventors: Daisuke Hayashi, Yamanashi (JP); Atsushi Kawabata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 219 days.

(21) Appl. No.: 16/892,328

(22) Filed: Jun. 4, 2020

(65) Prior Publication Data
US 2021/0384060 A1 Dec. 9, 2021

(51) Int. Cl.
*H01L 21/683* (2006.01)
*H01J 37/32* (2006.01)
*H01L 21/67* (2006.01)

(52) U.S. Cl.
CPC .... *H01L 21/6833* (2013.01); *H01J 37/32715* (2013.01); *H01J 37/32807* (2013.01); *H01J 2237/334* (2013.01); *H01L 21/67069* (2013.01)

(58) Field of Classification Search
CPC ........... H01L 21/6833; H01L 21/67069; H01L 21/67103; H01L 21/68757; H01L 21/68785; H01J 37/32715; H01J 37/32807; H01J 2237/334
USPC ........................................................ 361/234
See application file for complete search history.

(56) References Cited

U.S. PATENT DOCUMENTS

| | | | |
|---|---|---|---|
| 5,646,814 A * | 7/1997 | Shamouilian | H01L 21/6831 361/234 |
| 2012/0247671 A1 | 10/2012 | Sugawara | |
| 2012/0262834 A1* | 10/2012 | Eytan | H01L 21/6833 361/234 |
| 2018/0277418 A1* | 9/2018 | Sato | H01L 21/68764 |
| 2018/0315634 A1* | 11/2018 | Tsuno | H01L 21/68757 |
| 2018/0350561 A1 | 12/2018 | Yamaguchi et al. | |
| 2019/0311933 A1* | 10/2019 | White | H01L 21/6833 |
| 2020/0035468 A1* | 1/2020 | Momiyama | H01L 21/67109 |
| 2020/0043703 A1* | 2/2020 | French | H01J 37/32541 |

* cited by examiner

*Primary Examiner* — Dharti H Patel
(74) *Attorney, Agent, or Firm* — Xsensus LLP (57) ABSTRACT

A substrate support for use in a reaction chamber includes a base, and an in-situ electrostatic chuck. The chuck includes a first electrode in an upper portion of the chuck that is configured to hold a wafer to an upper surface of the upper portion by a first electrostatic attractive force under a condition of a first voltage is applied to the first electrode, and a second electrode that opposes an upper surface of the base and is configured to hold the chuck to the base by a second electrostatic attractive force under a condition that a second voltage is applied to the second electrode. Under a condition that the second voltage is not supplied to the second electrode, the second electrostatic attractive force is not present and the chuck is freed to be replaced in-situ without also removing the base and without exposing the reaction chamber to external atmosphere.

20 Claims, 8 Drawing Sheets

STRUCTURE FOR AUTOMATIC IN-SITU REPLACEMENT OF A PART OF AN ELECTROSTATIC CHUCK

TECHNICAL FIELD

The present disclosure relates to semiconductor manufacturing equipment and is generally directed to a method and an apparatus for processing substrates. More particularly, the disclosure relates to a substrate support that includes an in-situ replaceable electrostatic chuck (ESC) detachably attached to an aluminum stage (a base) provided in a plasma processing system (etching system).

BACKGROUND

Over time, semiconductor fabrication methods have improved with the introduction of new technologies, and as a consequence, the size of integrated circuits (ICs, microelectronic circuits, microchips, or simply "chips") fabricated as a single unit, as well as the feature sizes of components on the IC have also reduced. Miniaturized active and passive semiconductor devices, as well as interconnections are fabricated on a semiconductor substrate wafer (e.g., silicon). To form the ICs, the wafer is subjected to numerous processes, such as doping, ion implantation, etching, thin-film deposition of various materials, and photolithographic patterning. Finally, the individual microcircuits are separated by wafer dicing and then individually packaged as ICs.

Particular process steps employed in forming ICs on a substrate include Atomic Layer Deposition (ALD), Chemical Vapor Deposition (CVD) and Atomic Layer Etching (ALE). In a certain conventional process, an etching condition is changed according to a depth of a formed pattern. For example, in some conventional process, chamber pressure, RF power, flow ratio of the process gases are changed according to the depth of the formed pattern.

A plasma etching apparatus that performs the plasma etching process is configured, for example, by placing an upper electrode and a base serving as a lower electrode in a processing chamber under a vacuum state. While the wafer is held by a chuck, and the chuck is adhered to an aluminum base, plasma is generated and ions are injected into the wafer to thereby perform an etching process. In addition to being bombarded with high-energy ions, the chuck and the wafer have different thermal expansion coefficients, such that they rub against each other due to the difference between the thermal expansion coefficients. As a result, when processing of wafer is repeatedly continued, the surface of the chuck is gradually planarized. Therefore, a contact area between the wafer and chuck is changed, and consequently the heat transfer rate to the wafer changes which in turn causes a change in an etching characteristic of the wafer. When the shape of the surface of the chuck is out of an allowable range, it needs to be replaced. Because the chuck is usually adhered to the base, maintenance requires opening the process chamber, and exposing the processing chamber to an external atmosphere, so the base and the chuck can be removed and the chuck replaced.

Conventional electrostatic chucks often include a base, a dielectric layer, and a chuck main body. The dielectric layer is provided on the base, and is fixed to the base. The chuck main body is mounted on the dielectric layer. The chuck main body has a ceramic main body, a first electrode, a second electrode, and a third electrode. The ceramic main body has a substrate mounting region. The first electrode is provided in the substrate mounting region. During plasma generation, a direct current (DC) voltage is applied to the first electrode, and an electrostatic attractive force is generated between the chuck main body and the substrate so as to hold the substrate in place during processing. The electrostatic attractive force is removed while the chuck's main body and the base cool down at different rates so as to avoid warping the chuck when adhered to base during a cool down cycle.

Another conventional substrate processing apparatus includes a transportation chamber maintained in an atmospheric environment where a substrate is transported. After an operator observes that an upper portion of the electrostatic chuck has been sufficiently consumed as a result of plasma etching or the like, and needs to be replaced, the apparatus requires unlatching of a mechanical lock that holds the old electrostatic chuck to a base. An installation mechanism obtains a new electrostatic chuck that is stored in a stocker and replaces the older electrostatic chuck with the new one. Once the new electrostatic chuck is positioned properly, it is mechanically latched to the base. The mechanical latching mechanism includes mechanical pressing members installed on a side of the base. The electrostatic chuck is held between pressing members to prevent the electrostatic chuck from floating by pressure of heat transfer gas and other forces. Pressing members are formed such that an upper side of a standing plate installed on a side circumference of body part is bent toward the base at 90°. A support member that extends in a diameter direction of the base supports pressing members installed on the side circumference of base. An arcuate pressing unit is moved in the diameter direction of the base through support member by a driving mechanism installed in base to press and fix the electrostatic chuck horizontally.

SUMMARY

While numerous advantages effects are accomplished with the disclosed embodiments, one advantage with the embodiments of the present disclosure is that an electrostatic chuck is described that is replaceable in-situ by control of an attractive electrostatic force between a portion of the electrostatic chuck that needs to be replaced and either a bottom portion of the electrostatic chuck or the base. Releasing the electrostatic chuck in this way permits a transfer robot to replace a spent electrostatic chuck with a new one that is stored in a stocker, without having to expose the reaction chamber to an external atmosphere. As a consequence, precious run time is not lost to recondition the reaction chamber for subsequent processing.

The foregoing description has been provided by way of general introduction, and is not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

The present inventors recognized that substrate processing apparatuses using conventional electrostatic chucks have several limitations. For example, electrostatic chucks that have a ceramic portion (ceramic being an example of a class of dielectric materials) fixed to a base, requires that both the ceramic portion and the base be removed in order to replace the spent ceramic portion. To accomplish this, the electrostatic chuck and base must be removed from the processing chamber, exposing the processing chamber to an ambient environment, and thus requiring a lengthy cleaning and refurbish process to before the processing chamber is able to be used again.

Also, some conventional electrostatic chucks allow for removal and replacement of the ceramic portion of the electrostatic chuck in a controlled atmosphere of the SA, after it is recognized that the electrostatic chuck's physical characteristics have been sufficiently consumed so that the electrostatic chuck is no longer fit for service. However, as recognized by the present inventors, these systems rely on complicated mechanical latching mechanisms to hold the ceramic portion of the electrostatic chuck in place during use. Moreover, mechanical pressing members are disposed around the ceramic portion of the electrostatic chuck and require controlling of electrically controlled actuators to release the pressing members, and then reset them when a new electrostatic chuck is installed. Such system have added mechanical and control complexity, that not only increase cost, but require periodic maintenance to ensure proper actuation. When checking whether the pressing members are operating correction, and are correctly aligned, the SA is exposed to ambient atmosphere, which again takes the SA off-line for a prolonged period of time.

Other conventional electrostatic chucks employ electrostatic electrodes to detachably hold the ceramic plate to the base. This is done to avoid potential damage, such as warping, to the electrostatic chuck when the electrostatic chuck remains affixed to the base during heat/cool cycles. Detaching the electrostatic chuck from the base allows for the two structures to be detached during cool-down events where the thermal coefficients between the ceramic plate and metal (often aluminum) base cause relative movement and possible warping or other damage to one or both of the structures. However, as recognized by the present inventors, these systems do not incorporate electrical/mechanical transport mechanisms for the electrostatic chuck that allow for in-situ replacement of the electrostatic chuck.

In view of these limitations with conventional structures, the present inventors recognized the need for in-situ replacement of all or a part of an electrostatic chuck (sometimes also referred to as ESC) with a highly reliable electrically controlled electrostatic release mechanism. Moreover, by using an attractive electrostatic force as a way to adhere all or part of the electrostatic chuck to another part of the electrostatic chuck or base allows for rapid and reliable control of the adherence force on the wasted portion of electrostatic chuck. Furthermore, my using the electrostatic force as the adherence mechanism, mechanical interference is avoided with a transfer robot module (TMR) that accomplishes the function of moving the old electrostatic chuck to the stocker and replacing it with a new one. As such, not only is the amount of process down-time diminished with respect to conventional devices, but a reliability of operations is increased as the number of mechanical parts is lower than in conventional devices, and the amount of potential mechanical interference, and mechanical tolerance available, between the TMR and other structures (e.g., pressing mechanism), is lessened.

A configuration of the substrate processing apparatus SA according to an exemplary embodiment of the present disclosure will be described with reference to FIG. 1. Substrate processing apparatus SA includes transfer module TM (that operates at a reduced pressure with respect to the processing modules PMx) that includes a transfer robot module TMR to transport a wafer W (the term wafer and substrate are used interchangeably herein), as well as electrostatic chuck, to and from plasma etching modules PM1, PM2, and PM3, and a stocker/changer RM. The transfer module TM has a vacuum transportation chamber that interfaces with load lock chambers LL1, LL2. The plasma etching modules PM1, PM2 and PM3 are connected to the Transport module TM and partitioned from load lock chambers LL1, LL2. The stocker/changer RM is included in the transfer module TM and is used as a repository for tools, such as electrostatic chucks including portions of replacement upper portions of electrostatic chucks. The stocker RM may be positioned in any one of positions LP1 to LP4, or on the other face, remote from the TM, of each of the reaction chambers.

Load lock chambers LL1, LL2 provide a way to compartmentalize environments between the transfer module TM and the loader module LM. The loader module LM has a carrier placing table in which a carrier is placed. The carrier holds, for example, twenty five wafers W and is placed on a front surface of the loader module LM. The loader robot module LMR transports wafers between the carrier in the carrier placing table and the load lock chambers LL1, LL2. Carriers are exchanged in respective load ports LP1, LP2, LP3, and LP4 (for LPs in this example).

Figure 7:
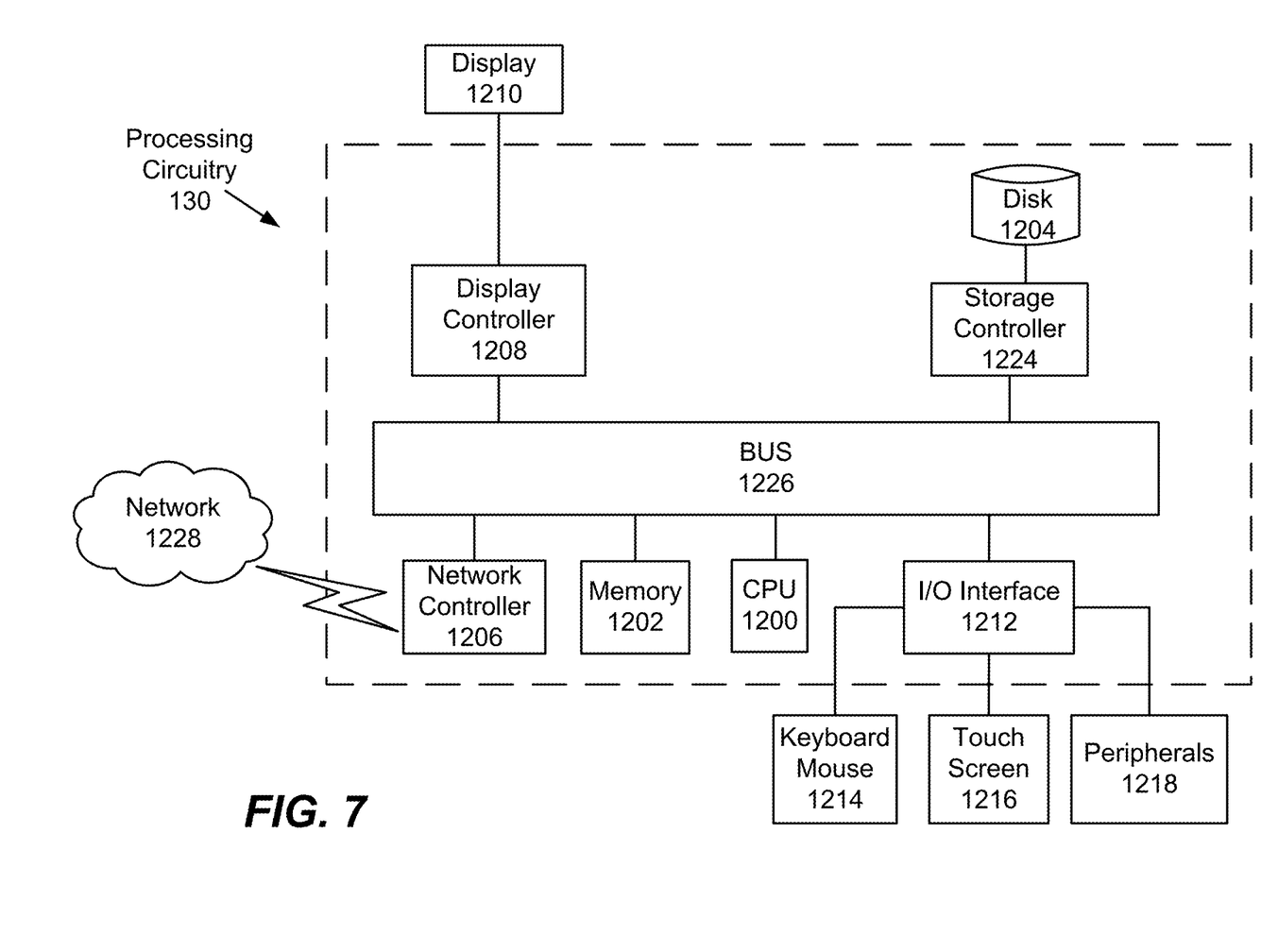
FIG. 7 is a diagram of controller circuitry that performs computer-based operations described herein.

A controller MC, in this example is a microcontroller, although a computer (local dedicated computer, or distributed computer) such as that described in FIG. 7 may be used as an alternative of controller circuitry that is configured by computer code to perform control operations described herein. Moreover, the controller MC controls operations of the substrate processing apparatus SA, including the exchange of electrostatic chucks or portions of the electrostatic chucks as will be discussed in more detail herein.

Figure 2:
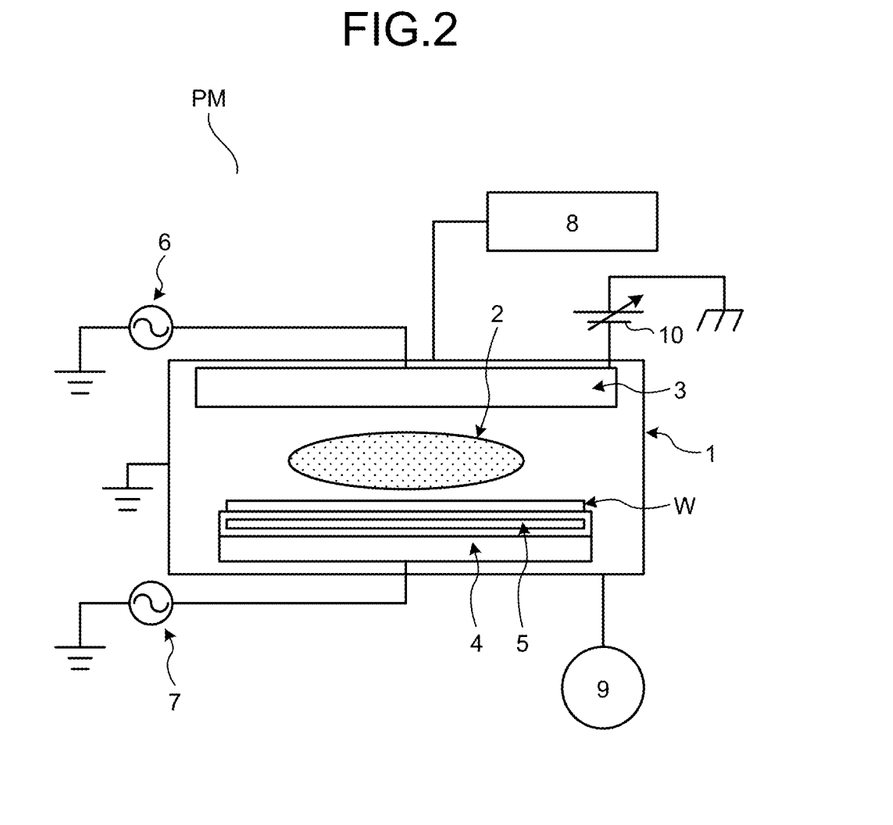
FIG. 2 is a diagram of a processing module (PM) of the exemplary SA.

FIG. 2 schematically illustrates a plasma processing module PM, e.g., a capacitively coupled plasma (CCP) plasma system, that couples to the transfer module via a gate valve (not shown). While a CCP system is shown as an example, an in-situ electrostatic chuck as described herein may also be used in other etching apparatuses, such as inductively coupled plasma (ICP) apparatus and the like. The plasma processing module PM includes a reaction chamber 1, which is approximately cylindrical in shape and formed of, for example, aluminum. The reaction chamber body 1 is connected to ground potential. A film having plasma resistance is formed on the inner wall surface of the reaction chamber body 1, and may be a film formed by an anodic oxidation treatment or a ceramic film, such as a film formed of yttrium oxide. When RF power is supplied to at least one of the upper electrode 3 and base 4 (serving as a lower electrode for generating plasma in the chamber), a plasma 2 is developed between the upper electrode 3 and the base 4, with a wafer W to be processed therebetween. The plasma is formed proximate the wafer W, and the wafer W is held on an upper surface of an electrostatic chuck 5 as will be discussed in more detail below.

The base 4 has an approximately disc shape and is conductive. In this non-exclusive example, the lower electrode 4 is formed of aluminum and the electrostatic chuck 5 has a main body that is ceramic and is detachably attached to the base 4 (although in a second embodiment a lower portion of the electrostatic chuck 5 remains adhered to the base 4).

A gas source 8 includes a plurality of gas sources that are controlled via a corresponding series of flow rate controllers (not shown). The gas source 8 provides the gases via one or more gas lines to the reaction chamber 1.

The plasma processing module PM further includes a first RF power supply 6 that generates RF energy in an inclusive range of 27 MHz through 100 MHz, with 60 MHz being an exemplary frequency. The first RF power supply 6 is connected to the upper electrode 3 through a matching circuit that matches an output impedance of the first RF power supply 6 and an impedance of the upper electrode 3.

The plasma processing module PM further includes a second RF power supply 7 that generates RF energy for bias purposes so as to attract ions to the substrate W. An operational frequency of the second RF power supply 7 is lower than that for the first RF power supply 6, typically in a range of 400 kHz to 13.56 MHz. In an alternate embodiment, multiple RF power sources 6, 7 may be coupled to the same electrode.

The upper electrode 3 has a second power supply, which is a variable direct current (DC) power source 10. The variable DC power source 10 may also serve as a DC bias for the RF energy applied to the upper electrode from the first RF power supply 6. The variability of the DC power source 10 allows for operational control over ion energy such that etch rates are controllable depending on the process being performed.

Figure 1:
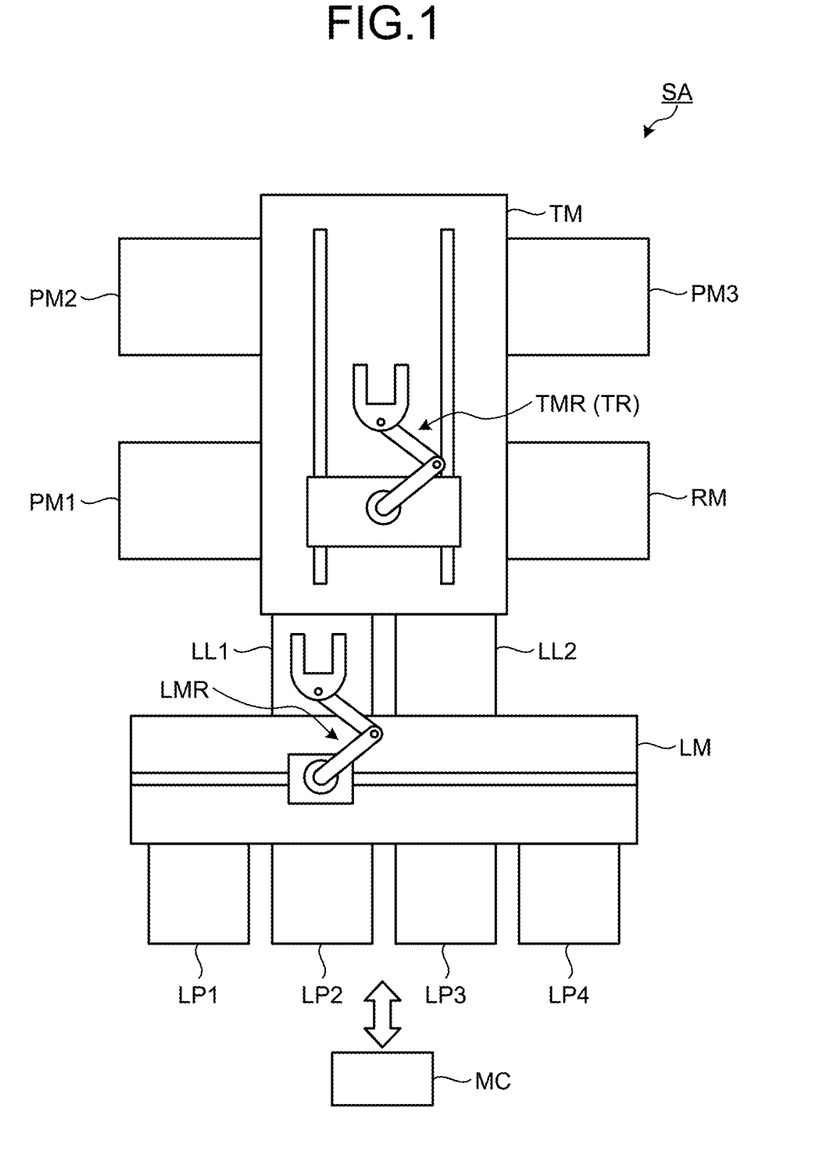
FIG. 1 is a diagram of an exemplary substrate processing apparatus (SA), or plasma processing (etching) system according to the present disclosure.

In an embodiment, the plasma processing module PM may have dedicated control circuitry (e.g., microcontroller, or computer such as that in FIG. 7) that operates exclusive of in or collaboration with the controller MC (FIG. 1). The controller MC executes a control program stored in memory, and controls each component of the plasma processing module PM based on recipe data stored in the storage device.

The processing module PM includes an exhaust device 9 that is connected to an internal atmosphere of the reaction chamber 1. The exhaust device 9 includes a pressure controller, such as an automatic pressure control valve, a vacuum pump (e.g., turbo molecular pump), so as to controllably depressurize the reaction chamber 1 and exhaust gases from the reaction chamber 1.

Figure 3:
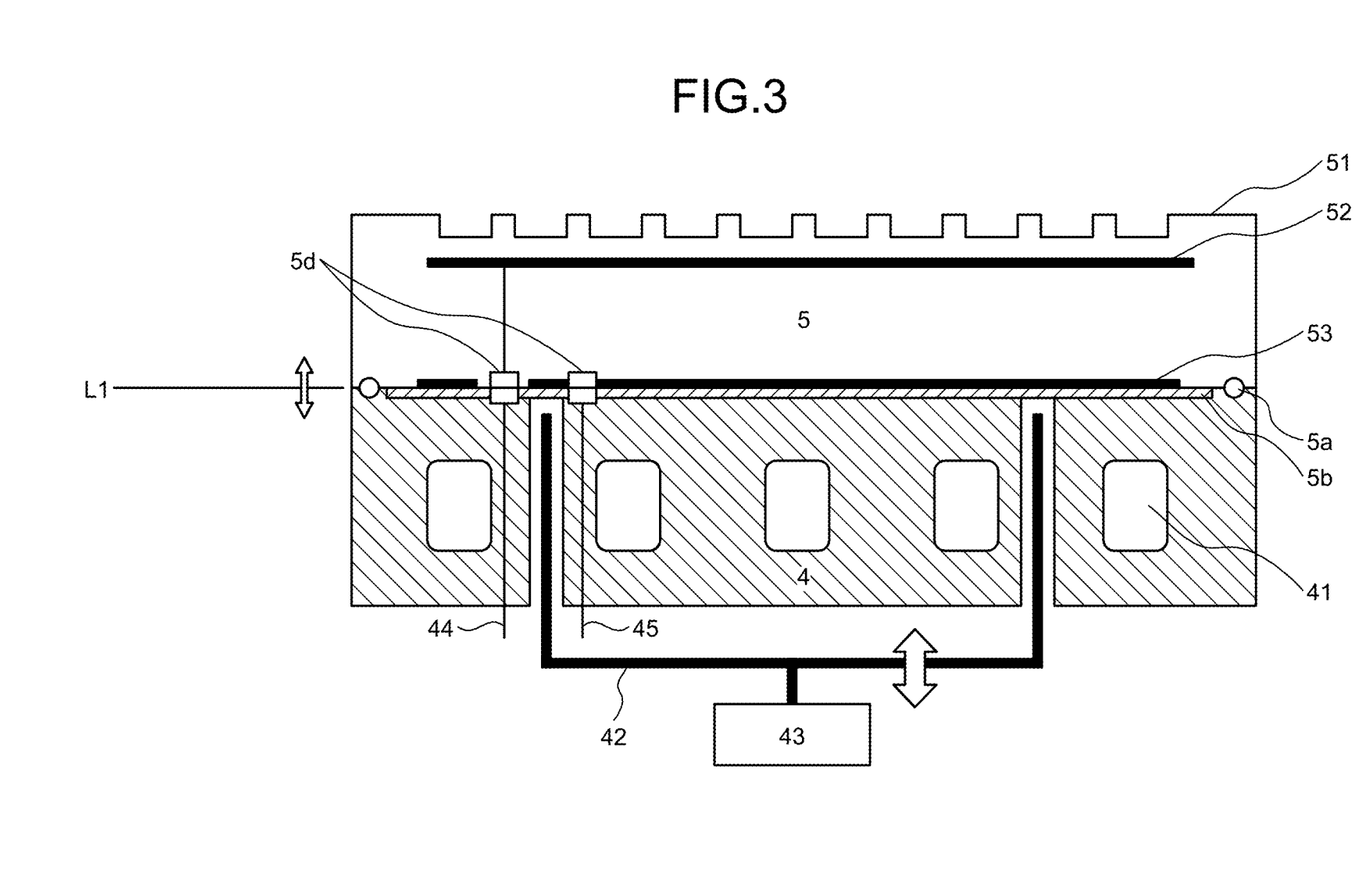
FIG. 3 is a diagram of an in-situ ESC of the exemplary PM according to a first embodiment of the present disclosure.

FIG. 3 is a diagram of a first embodiment of an in-situ replaceable electrostatic chuck 5 according to the present disclosure. The base 4 is an aluminum stage with coolant channels 41 formed therethrough. The coolant channels 41 allow a heat exchange medium, such as a refrigerant (e.g., Freon) for cooling the base 4, to flow therethrough. The heat exchange medium is supplied to the coolant channels 41 from a chiller provided outside the reaction chamber body 1 (FIG. 2) through a pipe and returned to the chiller through another pipe. This flow of heat exchange medium helps manage a temperature of the base 4.

The base 4 and a electrostatic chuck 5 sandwich a resin sheet 5*b* (such as KAPTON®) and a protective O-ring (or band) 5*a*. Moreover, the O-ring 5*a* extends around a periphery of an upper surface of the base 4, and a corresponding lower surface of an opposing portion of the electrostatic chuck 5. Grooves are formed in the base 4 and electrostatic chuck 5 to receive the O-ring 5*a*. If a band is used as a gasket in place of the O-ring 5*a*, the groove is optional depending on a thickness of the band. Likewise, a depression is optionally formed in a surface of the upper surface of the base 4 in which the resin sheet 5*b* is set. An interface where the base 4 and the electrostatic chuck 5 are separable occurs at a "separation line" L1, as shown in FIG. 3. The main body of the electrostatic chuck 5 is ceramic, which has a dielectric property for supporting electrostatic fields therein.

Through-holes extend from a bottom of the base 4 to the upper surface of the base 4, in which arms of a lifter 42 are disposed. While two arms (left and right) are shown in the view of FIG. 3, any number of arms/through-holes maybe included in the lifter 42. Three or more holes/through-arms provides a stable support for the electrostatic chuck 5 once separated from the base 4. The lifter 42 is driven by an actuator 43, which in this example is a stepper motor, although other controllable drive motors and actuation devices (e.g., solenoid valve) may be used as well. The lifter may also be used as a lifter for the wafer W.

When the MC (FIG. 1) generates a control signal to drive the actuator 43 to separate the electrostatic chuck 5 from the base 4, (in addition to removing power from the power supply lines 44 and 45 as will be discussed), the actuator urges the lifter 42 upward, toward the direction of the electrostatic chuck 5. Because an electrostatic force between base 4 and electrostatic chuck 5 has been removed by stopping a supply of power to the line 45 (as well as the line 44 which causes an attractive electrostatic force to hold the wafer, W, in place), the actuator 43 needs to only offset a weight of the electrostatic chuck 5 and an adhesion force of the resin sheet 5$b$ and O-ring 5$a$ in order to lift the electrostatic chuck 5 off of the base 4. Once lifted, the TMR (FIG. 1) or other robotic arm may remove the electrostatic chuck 5 from the reaction chamber 1 (FIG. 2) to the stocker RM under reduced pressure, but insulated from an external atmosphere. The TMR is configured to not only move and replace wafers W, but also grip and lift the electrostatic chuck 5, as well as the replacement electrostatic chuck 5.

The upper surface 51 of the electrostatic chuck 5 has ridges on an interior region on which the wafer W is held. The wafer W is held on the ridges of the upper surface 51 of the electrostatic chuck 5 while being processed in the reaction chamber 1 (FIG. 2), cooled by the coolant flowing in the base 4. Within the electrostatic chuck 5, and adjacent to the upper surface 51, the electrostatic chuck 5 has an upper electrode 52 (a DC electrode). The upper electrode 52 is energized with a DC voltage supplied from power supply line 44 and electrical charge distributes itself across the surface of the upper DC electrode 52. With the charge distributed on the upper DC electrode 52, the wafer W experiences an attractive force toward the upper DC electrode 52 due to an electrostatic field that is present in a dielectric medium between the wafer W and upper DC electrode 52. In this embodiment the dielectric medium includes ceramic material from the electrostatic chuck (and an internal atmosphere in gaps between the wafer W and ceramic material) that is sandwiched between the upper DC electrode 52 and the wafer W. The attractive electrostatic force continues until the voltage is removed from the power supply line 44 and the charge on the plate 52 is actively discharged or passively dissipates.

There are opposing contacts 5$d$, one on the side of the electrostatic chuck 5, and the other one the side of the base 4. The contacts 5$d$ are made of an electrically conductive material that need not be exclusively a metal, but may be made of a conductive elastic material, such as printable elastic conductors made from a mixture of Ag flakes, fluorine rubber, fluorine surfactant and organic solvent, may be used.

The electrostatic chuck 5 also includes a second electrode, namely a lower DC electrode 53 for electrostatic attraction to the base 4. The electrodes described herein for electrostatic attraction between the electrostatic chuck 5 and the base 4 need not be disc-shaped, and may either be monopolar or bipolar. The result-effective variable for the electrodes is an area. As such, in the example of a bipolar electrode, the electrode is formed from contiguous lines in the shape of geometric patterns, an aggregate surface area of which holds electrical charge for the electrode. The lower electrode 53 is disposed within a lower portion of the electrostatic chuck 5 (or on a lower surface of the electrostatic chuck 5), adjacent to an opposing upper surface of the base 4. The lower DC electrode 53 is electrically connected to a contact 5$d$ on a side of the electrostatic chuck 5. The contact 5$d$ opposes a corresponding contact that is connected to power supply line 45 so that electric current can pass through the power supply line 45 and to the lower DC electrode 53. An example voltage between the DC electrode 53 and the base 4 is 2.5 kV. When power is applied to power supply line 45, charge is distributed across the lower DC electrode 53 and an attractive electrostatic field is created between the lower DC electrode 53 and an upper surface of the base 4. The resin sheet 5$b$ serves as a high-strength dielectric such that a strong field is created between the lower electrode 53 and the base 4 without experiencing a voltage breakdown. Because a strong field exists in the resin sheet 5$b$, so too is the strength of the attractive force of the electrostatic chuck 5 to the base 4. However, once the MC controls the power supply to cease supplying a voltage to power supply line 45, the field between the lower DC electrode 53 and the base 4 dissipates, and the electrostatic attractive force is removed. As a consequence, the lifter 42 can easily lift the electrostatic chuck 5 off the base 4 when it is determined that the surface of the electrostatic chuck 5 has been consumed and needs to be replaced.

Figure 4:
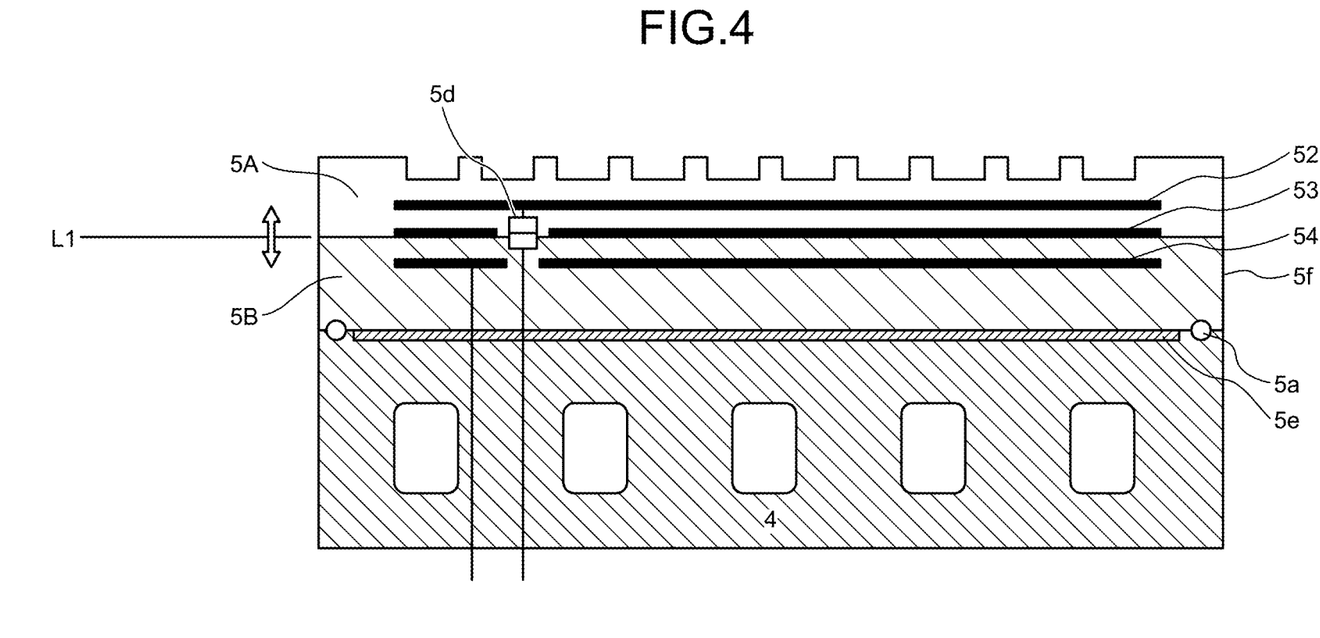
FIG. 4 is a diagram of an in-situ ESC of the exemplary PM according to a second embodiment of the present disclosure.

FIG. 4 is a diagram of a base and a controllably separable electrostatic chuck according to a second embodiment of the present disclosure. Features of the base 4 are similar to that of the first embodiment and so the descriptions are omitted. For example, the lifter, actuator, and power supply lines are the same. Rather than a resin sheet, an adhesive layer 5$e$ (adiabatic, or pressure-tight, layer) is sandwiched with the O-ring 5$a$ between the base 4 and a bottom segment 5B of the electrostatic chuck 5$f$. The adhesive holds the bottom segment 5B to the base 4.

In this embodiment, the electrostatic chuck 5$f$ has two ceramic parts: the bottom segment 5B, which remains adhered to the base 4, and a top segment 5A of the electrostatic chuck structure. The top segment 5A may be separated from the bottom segment 5B at the level separate line L1. The top segment 5A includes the upper DC electrode 52 for attraction of the wafer W, in the same way as described in the first embodiment. Likewise, the top segment 5A has therein the lower electrode 53 (or metal layer), as was the case with the first embodiment. In the present example, the lower electrode is passive and thus is not actively driven by a voltage source, and thus is also referred to as a metal layer. Moreover, unlike the first embodiment, DC power is not supplied to the lower electrode (metal layer) 53. Instead, power is applied to an electrode 54 in the bottom segment 5B of the electrostatic chuck 5$f$, and the electrostatic field is formed between the lower electrode 53 and the electrode 54 of the bottom segment. The ceramic material between the lower electrode 53 and the electrode 54 of the bottom segment serves as the dielectric in which the electrostatic force is held when power is supplied to the electrode 54 of the bottom segment. In an alternative embodiment, the DC voltage may be supplied to the lower electrode 53 and not the electrode 54 of the bottom segment. As a further variation, the resin sheet 5b from the first embodiment may be disposed between the lower electrode 53 and the electrode 54 of the bottom segment to support a greater electrostatic field with less risk of voltage breakdown of the dielectric medium.

Figure 5:
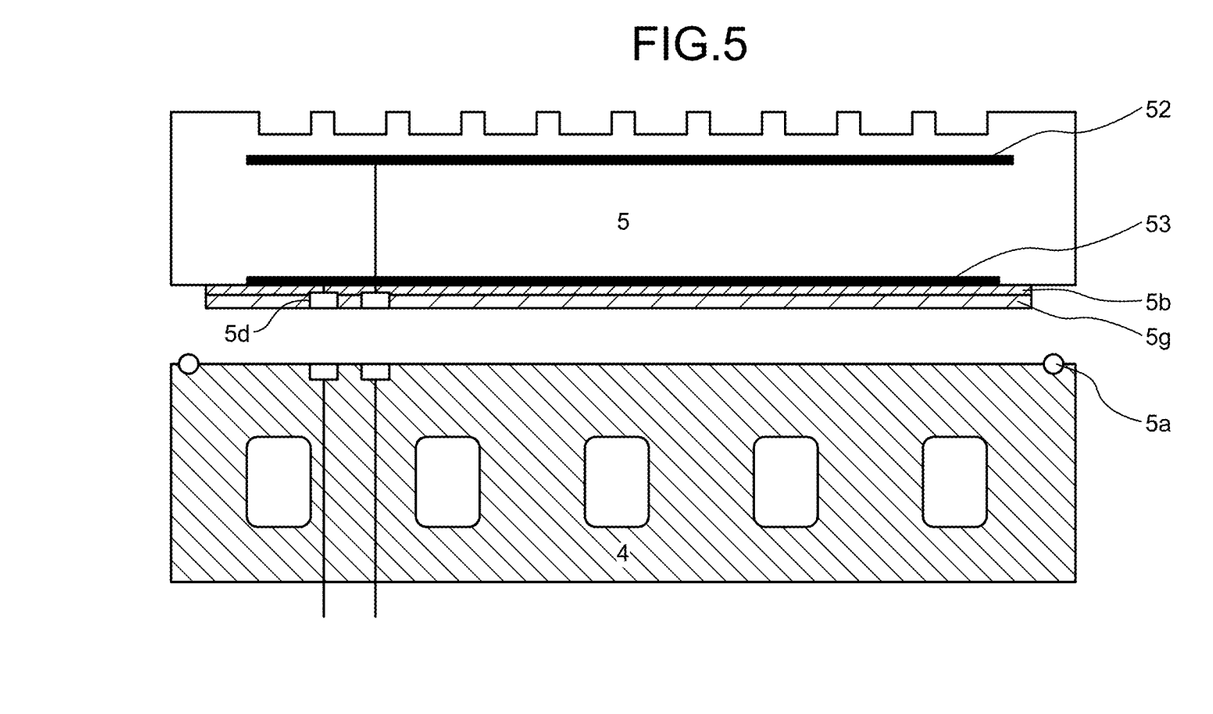
FIG. 5 is a diagram of an in-situ ESC of the exemplary PM according to a third embodiment of the present disclosure.

FIG. 5 is a diagram of an electrostatic chuck 5 according to a third embodiment of the present disclosure. Features of the base 4 are generally similar to that of the first and second embodiments and so the descriptions are omitted. For example, the lifter, actuator, and power supply lines are the same. Rather than a resin sheet 5b formed on an upper surface of the base 4, the resin sheet 5b is formed on a bottom surface of the electrostatic chuck 5. A highly heat-conductive sheet 5g is optionally disposed on a bottom surface of the resin sheet 5b. The bottom surface of the ceramic plate and the resin sheet 5b, and resin sheet 5b and the highly heat-conductive sheet 5g may be bonded any way, such as molecular bonding, that can achieve high adhesion and high thermal resistance. The highly heat-conductive sheet 5g is made from a soft thermally conductive sheet disposed between the resin sheet 5b and the base 4 to stabilize a contact therebetween. An exemplary material for the highly heat-conductive sheet 5g is silicone rubber. Examples of filler used in the highly heat-conductive sheet (enhancing heat transfer between the stage and the ceramic plate) include alumina, aluminum nitride (AlN), and other highly heat-conductive powder. The material may be selected in view of required characteristics, such as thermal conductivity and hardness of the sheet. Examples of the resin sheet 5b include polyimide sheets and PET sheets having a thickness in the range of about 50 μm to about 100 μm. The highly heat-conductive sheet 5g may be replaced with or may be used together with gas, such as helium, that is introduced between the top surface of the ESC and the base 4 to enhance the thermal conductivity. Parameters that vary thermal conductivity may be a variable attractive force and a variable pressure of helium gas. Moreover, an electrostatic chuck with a built-in heater may be used as well.

In this embodiment, the base 4 has two contact terminals, for the two DC power sources, disposed on an upper surface of the base 4 so as to make electrical contact with opposing terminals 5d that emerge at a bottom surface of the ceramic plate/resin sheet/heat-conductive sheet layered structure. One of the contacts provides DC voltage to the lower DC electrode 53 for the electrostatic chuck 5. The other contacts provide DC voltage from another DC power source to the upper electrode 52 adjacent to an upper surface of the electrostatic chuck 5, for electrostatically attracting the wafer W. The power line from the contact 5g to the upper DC electrode 52 adjacent to an upper surface of the electrostatic chuck 5 is electrically insulated from the lower electrode 53 for the electrostatic chuck 5.

Figure 6A:
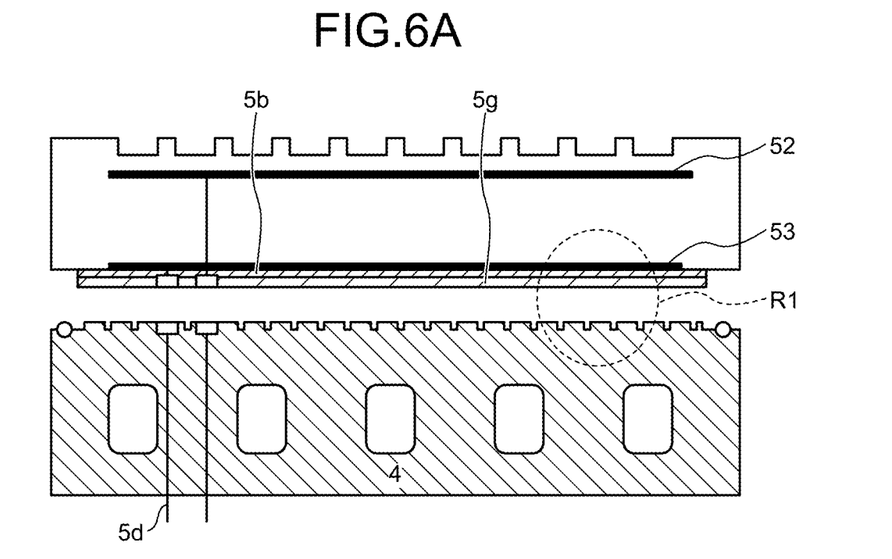
FIGS. 6A-6C are diagrams of an in-situ ESC of the exemplary PM according to a fourth embodiment of the present disclosure.

FIG. 6A is a diagram of an electrostatic chuck 5 according to a fourth embodiment of the present disclosure. Features of the base 4, electrostatic chuck 5, resin sheet 5b, and highly heat-conductive sheet 5g are generally similar to that of the third embodiment and so the descriptions are omitted. For example, the lifter, actuator, and power supply lines are the same.

Figure 6B:
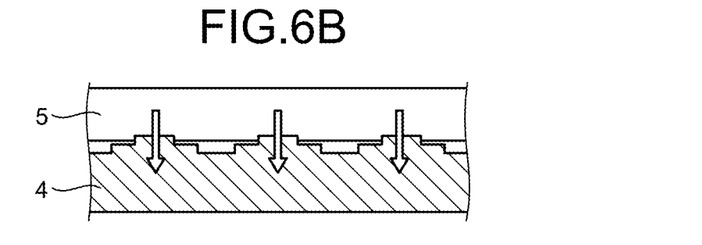
Figure 6C:
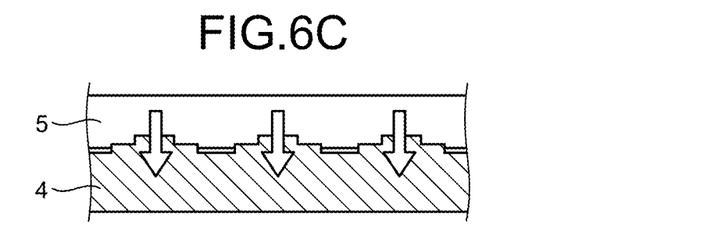

However, the upper surface of the base 4 is formed (by e.g., plating, deposition, or machining) to have protrusions formed thereon. FIGS. 6B and 6C show enlarged areas of region R1 in FIG. 6a. FIG. 6B shows an interaction between protrusions on the top surface of the base 4 engage with a bottom surface of the highly heat-conductive sheet 5g when there is a relatively small electrostatic attractive force applied between the base 4 and electrostatic chuck 5. In contrast, FIG. 6C shows an interaction where a more significant electrostatic attractive force is applied between the base 4 and electrostatic chuck 5 than in FIG. 6B. As seen, the highly heat-conductive sheet 5g is forced deeper in between adjacent protrusions in the surface of the base 4. Although the protrusions show a two stepped structure, one step or more than two steps, or other geometric shapes may be used. The effective variable is the number of corners of the protrusions that help to grip the highly heat-conductive sheet 5g when the highly heat-conductive sheet 5g is formed down and around the corners, thus increasing the lateral friction therebetween.

FIG. 7 is a block diagram of processing circuitry for performing computer-based operations described herein. FIG. 7 illustrates control circuitry 130 that may be used to control any computer-based control processes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 7, the processing circuitry 130 includes a CPU 1200 which performs one or more of the control processes described above/below. The process data and instructions may be stored in memory 1202. These processes and instructions may also be stored on a storage medium disk 1204 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry 130 communicates, such as a server or computer.

Further, the claimed advancements may be provided as a utility application, background daemon, or component of an operating system, or combination thereof, executing in conjunction with CPU 1200 and an operating system such as Microsoft Windows, UNIX, Solaris, LINUX, Apple MAC-OS and other systems known to those skilled in the art.

The hardware elements in order to achieve the processing circuitry 130 may be realized by various circuitry elements. Further, each of the functions of the above described embodiments may be implemented by circuitry, which includes one or more processing circuits. A processing circuit includes a particularly programmed processor, for example, processor (CPU) 1200, as shown in FIG. 7. A processing circuit also includes devices such as an application specific integrated circuit (ASIC) and conventional circuit components arranged to perform the recited functions.

In FIG. 7, the processing circuitry 130 includes a CPU 1200 which performs the processes described above. The processing circuitry 130 may be a general-purpose computer or a particular, special-purpose machine. In one embodiment, the processing circuitry 130 becomes a particular, special-purpose machine when the processor 1200 is programmed to perform ESC in-situ replacement by controlling voltages and robot arms to replace the ESC without exposing the reaction chamber to an external atmosphere.

Alternatively, or additionally, the CPU 1200 may be implemented on an FPGA, ASIC, PLD or using discrete logic circuits, as one of ordinary skill in the art would recognize. Further, CPU 1200 may be implemented as multiple processors cooperatively working in parallel to perform the instructions of the inventive processes described above.

The processing circuitry 130 in FIG. 7 also includes a network controller 1206, such as an Intel Ethernet PRO network interface card from Intel Corporation of America, for interfacing with network 1228. As can be appreciated, the network 1228 can be a public network, such as the Internet, or a private network such as an LAN or WAN network, or any combination thereof and can also include PSTN or ISDN sub-networks. The network 1228 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 130 further includes a display controller 1208, such as a graphics card or graphics adaptor for interfacing with display 1210, such as a monitor. A general purpose I/O interface 1212 interfaces with a keyboard and/or mouse 1214 as well as a touch screen panel 1216 on or separate from display 1210. General purpose I/O interface also connects to a variety of peripherals 1218 including printers and scanners.

The general-purpose storage controller 1224 connects the storage medium disk 1204 with communication bus 1226, which may be an ISA, EISA, VESA, PCI, or similar, for interconnecting all of the components of the processing circuitry 130. A description of the general features and functionality of the display 1210, keyboard and/or mouse 1214, as well as the display controller 1208, storage controller 1224, network controller 1206, sound controller 1220, and general purpose I/O interface 1212 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Figure 8:
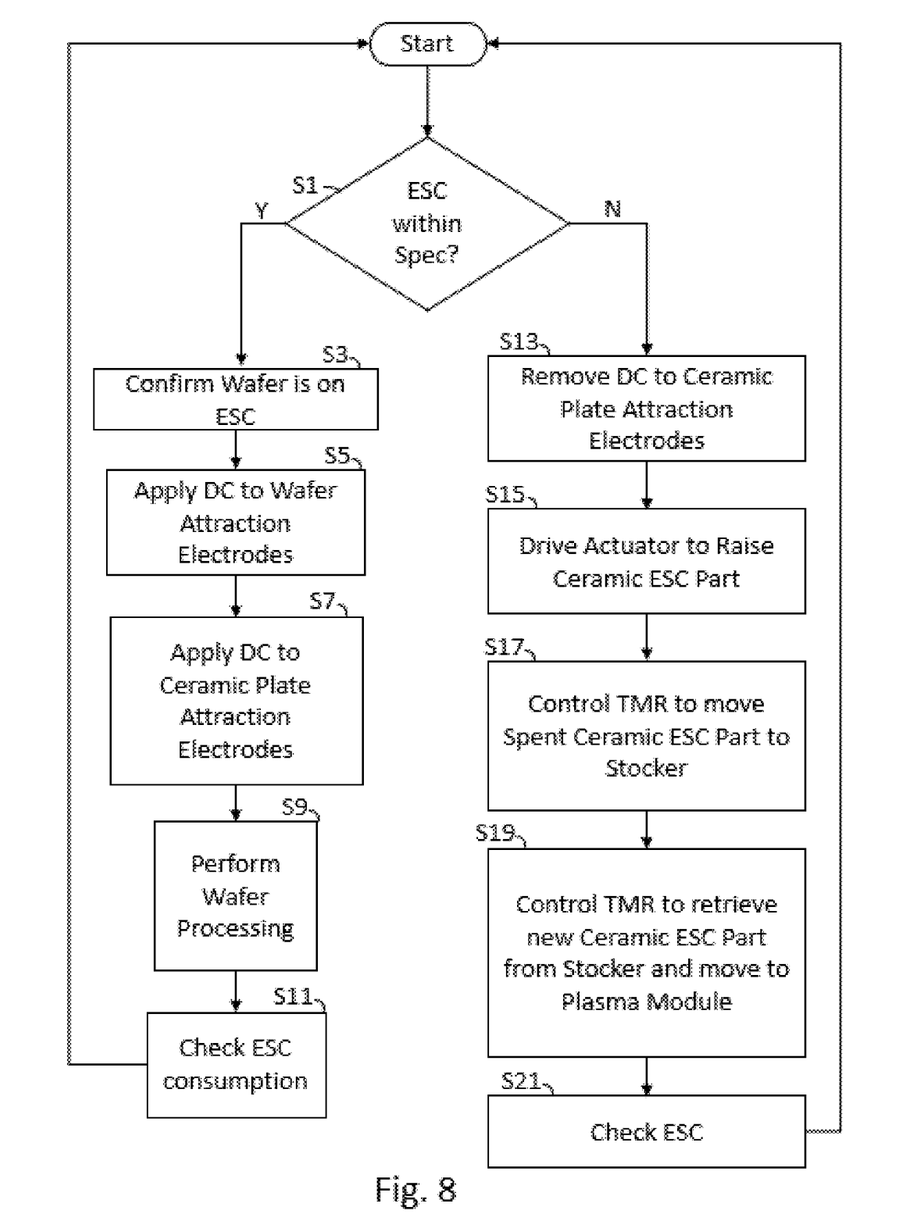
FIG. 8 is a flow diagram of a process flow performed by controller circuitry of the SA to control operation, inspection, and removal of a ESC according to the present disclosure.

FIG. 8 is a flowchart of a control process performed according to teachings of the present disclosure. The process begins in step S1 where a query is made regarding whether the structure of the electrostatic chuck (ESC) is within specification or not. If the response to the query is affirmative, then the electrostatic chuck is structurally sound and can adequately hold the wafer W in place during reactor processing without compromising etching characteristics. The process then proceeds to step S3, where it is confirmed that the wafer W is place on top of the electrostatic chuck in the correct place. Then, in steps S5 and S6, the controller MC causes DC power supplies to apply to DC voltage to electrodes to attract the wafer to the electrostatic chuck, and to attract the electrostatic chuck (or part of the electrostatic chuck) to the base 4 or the other part of the ceramic plate (embodiment 2). The process then proceeds to step S9 where the wafer W is processes, perhaps by etching. Once the process is complete, a sensor (or visual inspection) checks whether the electrostatic chuck has been consumed beyond at minimum threshold, and the process returns to step S1.

If the response to step S1 is negative, the process proceeds to step S13, where the controller MC removes power to the ceramic plate electrodes and in step S15 drives the actuator to raise the lifter along with the electrostatic chuck 5 (or part of the electrostatic chuck's ceramic plate). The process then proceeds to step S17 where the MC causes the TMR to move the spent electrostatic chuck 5 (or part of the electrostatic chuck) to the stocker RM, and then retrieve, in step S19 a replacement electrostatic chuck 5 (or part of the ceramic plate) to be placed on top of the base (or other part of the ceramic plate) inside the reaction chamber. Subsequently, the controller causes the system to check whether the ESC is satisfactorily installed, in step S21, and then the process returns to step S1 to repeat the process.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

ELEMENT REFERENCE NUMERALS

L1 Level Separation Line
LLx Load Lock Chamber x
LM Loader Module
LMR Loader Robot Module
LPx Load Port x
MC Controller (Microcontroller, local or remote computer)
PMx Plasma Module x
R1 Region 1
RM Stocker/Changer
SA Substrate Processing Apparatus
TM Transfer Module TMR(TR), LMR Transfer Robot Module
1 Reaction Chamber
2 Plasma
3 Upper Electrode
4 Base
5 Electrostatic Chuck (ESC)
5A Top Segment of ESC to be Exchanged
5B Bottom Segment of ESC Structure
5a Protective O-ring or Band
5b Resin Sheet
5c,d Contact Terminal
5e Adhesive (* adiabatic layer)
5f Ceramic Plate Structure
5g Highly Heat-Conductive Sheet
6 Radio Frequency (RF) Source
7 RF Source
8 Gas Source
9 Exhaust Device
10 Variable Direct Current (DC) Power Source
41 Coolant Channel
42 Lifter
43 Actuator
44, 45 Power Supply Lines
51 Ceramic Plate Upper Surface
52 Upper Electrode for Wafer Attraction
53 Lower Electrode, Metal layer for Ceramic Plate Attraction
54 Electrode of Bottom Segment of Ceramic Plate Structure

The invention claimed is:

1. A substrate support comprising:
a base; and
an electrostatic chuck having an upper portion that is separable from a lower portion, the lower portion being retained on the base and the upper portion being in-situ replaceable, wherein
the upper portion of the electrostatic chuck including a top ceramic plate having
a first electrode that controllably holds a wafer to an upper surface of the top ceramic plate by a first electrostatic attractive force generated in response to a first voltage applied the first electrode, and
a metal layer disposed between the first electrode and an upper surface of the lower portion of the electrostatic chuck, and
the bottom portion of the electrostatic chuck including a second electrode that controllably holds the upper portion to the lower portion by a second electrostatic attractive force generated in response to a second voltage applied to one of the second electrode and the metal layer.

2. The substrate support of claim 1, wherein
the lower portion of the electrostatic chuck includes a bottom ceramic plate having the second electrode therein, and under a condition that the second voltage is applied to the second electrode, the second attractive force is generated between the metal layer and second electrode.

3. The substrate support of claim 1, wherein under a condition that the second voltage is applied to the metal layer, the second attractive force is generated between the metal layer and second electrode.

4. The substrate support of claim 1, further comprising a pair of contact terminals that
are electrically connected to each other under a condition of the upper portion being held to the lower portion by the second electrostatic attractive force, and
are electrically separated from each other under a condition of the upper portion being separated from the lower portion, wherein the first voltage being applied to the first electrode from a first voltage source via the pair of contact terminals under the condition of the upper portion being held to the lower portion by the second electrostatic attractive force.

5. The substrate support of claim 1, further comprising an adhesive material that fixes the lower portion of the electrostatic chuck to the base, wherein the bottom portion comprises a ceramic plate.

6. The substrate support of claim 1, further comprising controller circuitry, the controller circuitry being configured to
terminate a supply of the second voltage to the one of the second electrode and the metal layer so as to controllably remove second electrostatic attractive force between the upper portion of the electrostatic chuck from the lower portion of the electrostatic chuck, and
control an operation of an actuator and lifter to lift the upper portion of the electrostatic chuck off the lower portion of the electrostatic chuck.

7. The substrate support of claim 6, wherein
the base and the lower portion of the electrostatic chuck are disposed in a reaction chamber, and
the controller circuitry is further configured to operate a transfer robot to replace the upper portion of the electrostatic chuck with another upper portion without exposing the reaction chamber to an external atmosphere.

8. The substrate support of claim 1, wherein the second electrode being a bipolar electrode.

9. A substrate support for use in a reaction chamber, the substrate support comprising:
a base; and
an electrostatic chuck having
a first electrode in an upper portion of the electrostatic chuck that is configured to hold a wafer to an upper surface of the upper portion by a first electrostatic attractive force under a condition of a first voltage is applied to the first electrode, and
a second electrode that opposes an upper surface of the base and is configured to hold the electrostatic chuck to the base by a second electrostatic attractive force under a condition that a second voltage is applied to the second electrode, wherein
under a condition that the second voltage is not supplied to the second electrode, the second electrostatic attractive force is not present and the electrostatic chuck is freed to be replaced in-situ without also removing the base and without exposing the reaction chamber to an external atmosphere.

10. The substrate support of claim 9, further comprising:
a resin sheet disposed between the base and the second electrode of the electrostatic chuck, the resin sheet being a dielectric material that holds an electrostatic field therein under the condition that the second voltage is applied to the second electrode.

11. The substrate support of claim 10, further comprising:
a heat-conductive sheet disposed between the resin sheet and the base.

12. The substrate support of claim 11, wherein an upper surface of base directly contacts the heat-conductive sheet.

13. The substrate support of claim 12, wherein the upper surface of the base includes a plurality of protrusions, each of the plurality of protrusions having a contact area with the heat-conductive sheet.

14. The substrate support of claim 13, wherein an amount of contact area of each of the plurality of protrusions with the heat-conductive sheet increases with a magnitude of the second electrostatic attractive force.

15. The substrate support of claim 9, wherein
the electrostatic chuck comprises a ceramic plate,
the first electrode being disposed in an upper portion of the ceramic plate,
the second electrode being disposed in a lower portion of the ceramic plate or on a lower surface of the ceramic plate.

16. The substrate support of claim 9, further comprising:
a first pair of contact terminals and a second pair of contract terminals, wherein
the first pair of contact terminals being electrically connected to each other, and the second pair of contact terminals being electrically connected to each other under a condition that the electrostatic chuck is held to the base by the second electrostatic attractive force,
the first pair of contact terminals being disconnected from each other, and the second pair of contact terminals being disconnected from each other under a condition that electrostatic chuck is separated from the base,
a connection between the first pair of contact terminals provides an electrical path from a first voltage source to the first electrode, and
a connection between the second pair of contact terminals provides an electrical path from a second voltage source to the second electrode.

17. The substrate support of claim 9, further comprising:
a controller having circuitry configured to
control a removal of the second voltage so as to controllably release the electrostatic chuck from the base, and
control an operation of an actuator and lifter to lift the electrostatic chuck off the base.

18. The substrate support of claim 17, wherein
the circuitry is further configured to operate a transfer robot to replace the electrostatic chuck with another electrostatic chuck without exposing the reaction chamber to an external atmosphere.

19. The substrate support of claim 9, wherein the second electrode being a bipolar electrode.

20. An in-situ replaceable electrostatic chuck comprising:
a body having an upper surface and a bottom surface;
a thermally conductive resin sheet disposed on the bottom surface of the body, wherein
the body including a dielectric plate having
a first electrode disposed within an upper portion of the dielectric plate and having an upper surface that is oriented to support a wafer thereon,
a second electrode disposed in a bottom portion of the dielectric plate or on a bottom surface of the body, the bottom surface being oriented to oppose an upper surface of a base,
a first electrical conductor that provides a first voltage to the first electrode from a first voltage source, and
a second electrical conductor that provides a second voltage to the second electrode from a second voltage source.

* * * * *

UNITED STATES PATENT AND TRADEMARK OFFICE
CERTIFICATE OF CORRECTION

| | |
|---|---|
| PATENT NO. | : 11,380,573 B2 |
| APPLICATION NO. | : 16/892328 |
| DATED | : July 5, 2022 |
| INVENTOR(S) | : Hayashi et al. |

It is certified that error appears in the above-identified patent and that said Letters Patent is hereby corrected as shown below:

In the Claims

In Column 13, Line 46, change "the bottom portion" to --the lower portion--.

In Column 14, Line 10, change "the bottom portion" to --the lower portion--.

Signed and Sealed this
First Day of November, 2022

Katherine Kelly Vidal
*Director of the United States Patent and Trademark Office*